(12) United States Patent
Benwadih et al.

(10) Patent No.: US 8,314,451 B2
(45) Date of Patent: Nov. 20, 2012

(54) ORGANIC FIELD-EFFECT TRANSISTOR

(75) Inventors: Mohammed Benwadih, Champigny sur Marne (FR); Cécile Bory, Le Fontanil (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 263 days.

(21) Appl. No.: 12/777,452

(22) Filed: May 11, 2010

(65) Prior Publication Data

US 2010/0289015 A1 Nov. 18, 2010

(30) Foreign Application Priority Data

May 14, 2009 (FR) .................................. 09 02338

(51) Int. Cl.
*H01L 51/10* (2006.01)
(52) U.S. Cl. ................... 257/295; 257/40; 257/E51.006
(58) Field of Classification Search ................ 257/295
See application file for complete search history.

(56) References Cited

U.S. PATENT DOCUMENTS

| | | | | |
|---|---|---|---|---|
| 3,585,415 | A * | 6/1971 | Muller et al. | 310/319 |
| 5,883,419 | A * | 3/1999 | Lee et al. | 257/417 |
| 7,029,945 | B2 * | 4/2006 | Veres et al. | 438/99 |
| 7,982,249 | B2 * | 7/2011 | Worledge | 257/261 |
| 2007/0018328 | A1 * | 1/2007 | Hierlemann et al. | 257/762 |
| 2008/0283877 | A1 * | 11/2008 | Collonge et al. | 257/254 |
| 2008/0290384 | A1 * | 11/2008 | Lolivier et al. | 257/295 |

OTHER PUBLICATIONS

Or et al.; "P(VDF-TrFE) Copolymer Acoustic Emission Sensors;" Elsevier Science Sensors and Actuators, vol. 80, No. 3; Mar. 1, 2000; pp. 237-241.
Müller et al.; "A Polymer High-*k* dielectric Insulator for Organic Field-Effect Transistors;" Journal of Applied Physics, No. 98, No. 5; Sep. 8, 2005; 3 sheets.
Müller et al.; "Organic Field-Effect Transistors with Ferroelectric Hysteresis;" Elsevier Science Direct; Thin Solid Films; vol. 515, No. 9; Jul. 16, 2007; pp. 7683-7687.
FR Search Report dated Jan. 8, 2010 for FA 0902338 and FR721089 (no English translation available).

* cited by examiner

*Primary Examiner* — Matthew W Such
*Assistant Examiner* — Robert Carpenter
(74) *Attorney, Agent, or Firm* — Daly, Crowley, Mofford & Durkee, LLP

(57) ABSTRACT

An organic field-effect transistor includes: source and drain electrodes; a semiconductor layer made of an organic semiconductor material placed at least between said source and drain electrodes; a gate electrode suitable for creating an electric field that increases the density of mobile charge carriers in the semiconductor layer in order to create a conduction channel in this semiconductor layer between the source and drain electrodes when a voltage $V_G$ is applied to the gate electrode; and an electrical insulator layer interposed between the gate electrode and the semiconductor layer, characterized in that it further includes a piezoelectric layer placed close to the conduction channel, in the semiconductor layer between the source and drain electrodes or on the opposite side of the gate electrode with respect to the electrical insulator and semiconductor layers, alongside the source and drain electrodes, said piezoelectric layer being electrically isolated from said source and drain electrodes and from the semiconductor layer.

10 Claims, 3 Drawing Sheets

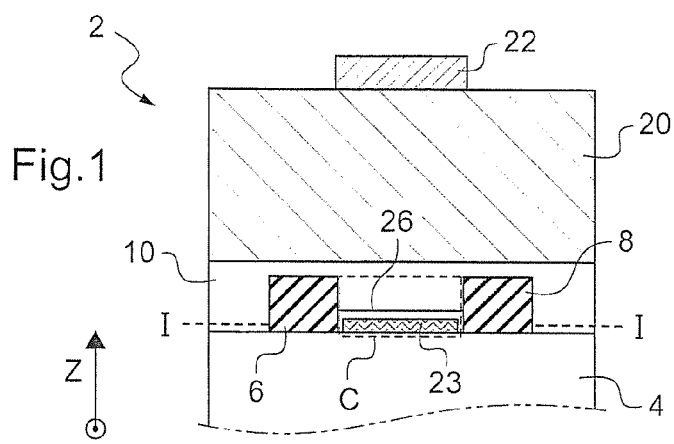
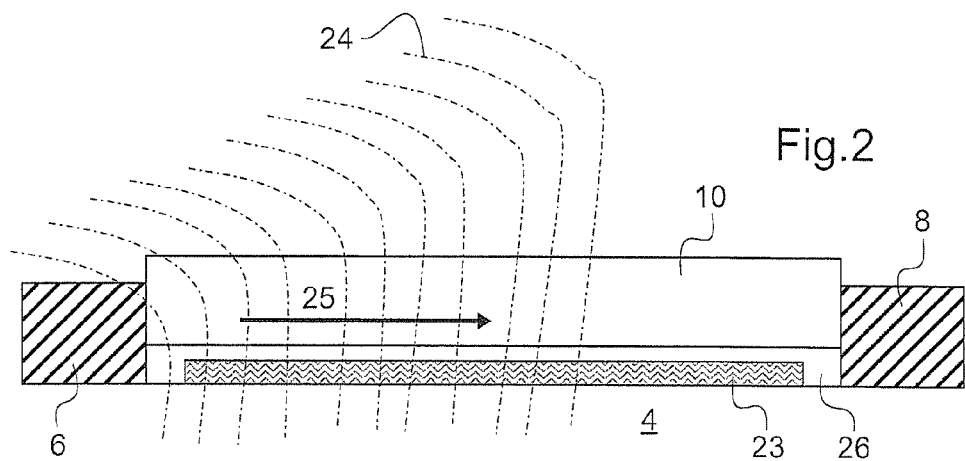
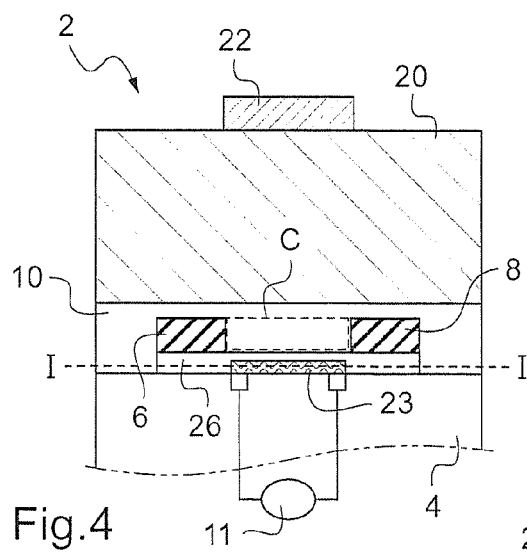
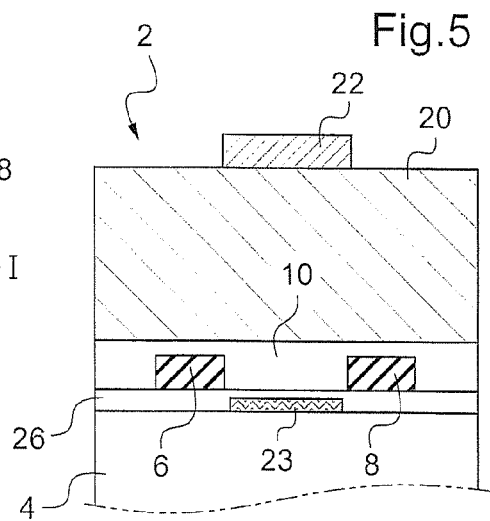

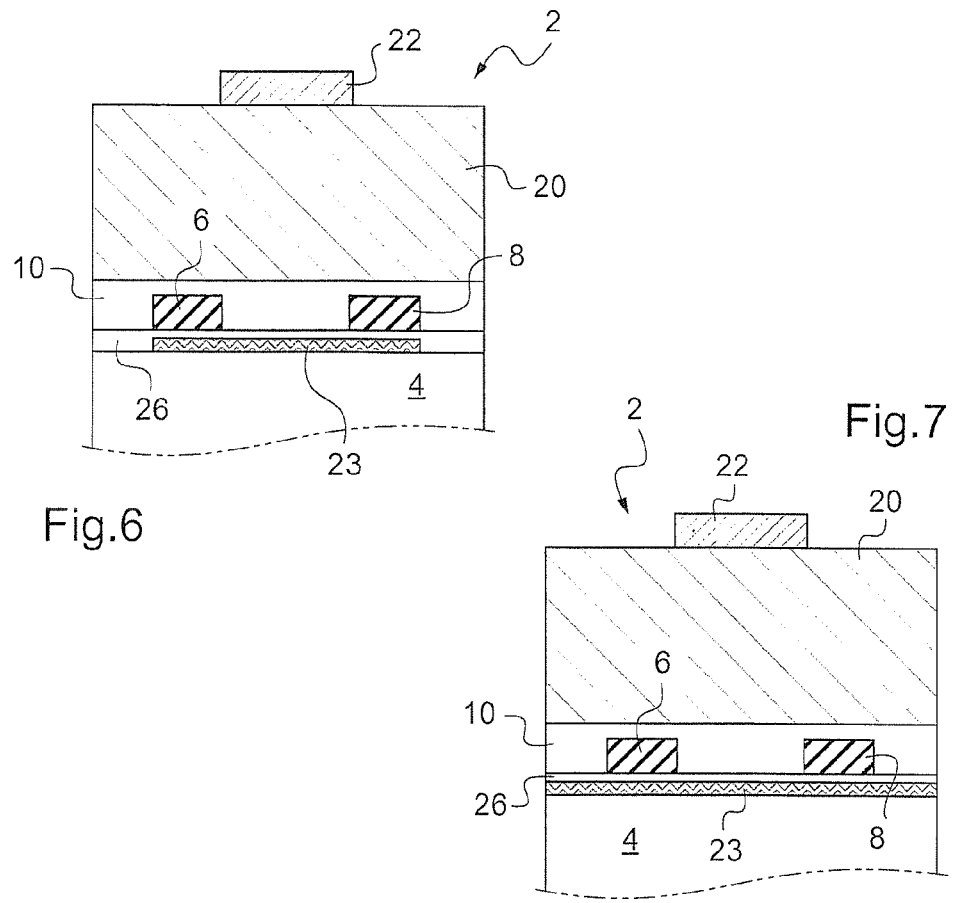
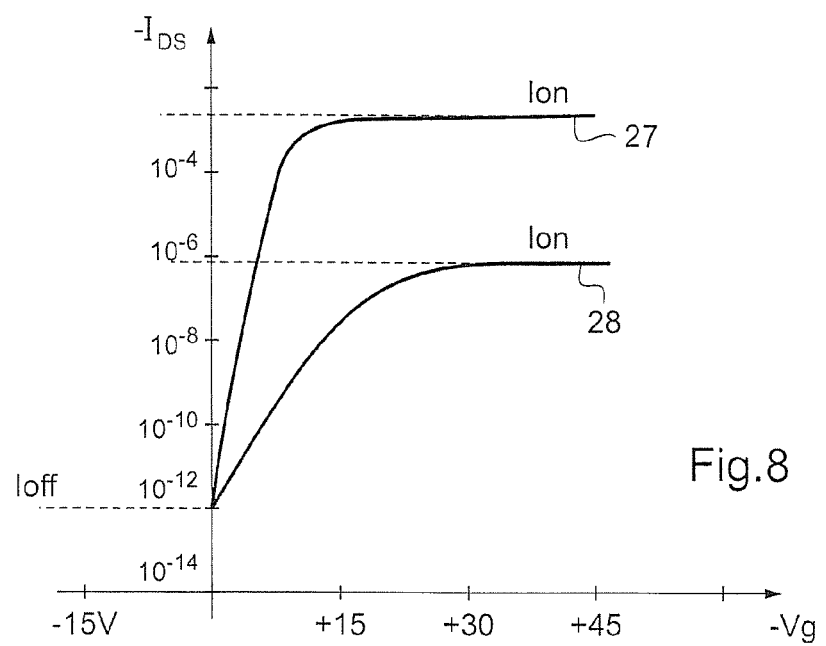

ORGANIC FIELD-EFFECT TRANSISTOR

CROSS REFERENCE TO RELATED APPLICATION

This application claims the benefit of French Application No. FR0902338 filed on May 14, 2009, which application is hereby incorporated herein by reference in its entirety.

BACKGROUND OF THE INVENTION

The present invention relates to an organic field-effect transistor. Organic field-effect transistors known at the present time comprise: source and drain electrodes; a semiconductor layer made of an organic semiconductor material placed at least between said source and drain electrodes; a gate electrode; and an electrical insulator layer interposed between the gate electrode and the semiconductor layer.

When a potential is applied to the gate electrode, the charge carriers present in the semiconductor layer concentrate at the interface between the semiconductor layer and the insulator, while remaining only in the semiconductor layer. This concentration of charge carriers then forms the conduction channel characteristic of the on-state of the transistor.

Organic field-effect transistors are produced using organic semiconductor materials and are also known by the acronym OFET (Organic Field Effect Transistor).

An organic semiconductor is an organic compound, in the form of a crystal or a polymer, which exhibits properties similar to inorganic semiconductors. These properties are conduction by electrons and holes, and the presence of a bandgap. These materials give rise to organic electronics.

In particular, the discovery in 1970 of polymers having a conducting character has instigated a real surge in activity in the huge field of microelectronics, offering new prospects in the fabrication of components on low-cost plastic substrates. In the last few years, considerable progress has been made in this new field of research, commonly referred to as "plastic electronics". Display screens based on organic light-emitting diodes (OLEDs) integrated into digital cameras, car radios or even in electric razors have already been commercialized. This fantastic development in OLEDs has therefore spurred research in other applications of organic electronics, such as photovoltaic solar panels based on organic semiconductors or organic field-effect transistors, which would allow the fabrication of low-cost integrated circuits on flexible substrates.

However, it is endeavored to improve the electrical conduction performance of organic transistors.

SUMMARY OF THE INVENTION

For this purpose, the present invention provides an organic field-effect transistor comprising: source and drain electrodes; a semiconductor layer made of an organic semiconductor material placed at least between said source and drain electrodes; a gate electrode suitable for creating an electric field that increases the density of mobile charge carriers in the semiconductor layer in order to create a conduction channel in this semiconductor layer between the source and drain electrodes when a voltage $V_G$ is applied to the gate electrode; and an electrical insulator layer interposed between the gate electrode and the semiconductor layer, characterized in that it further includes a piezoelectric layer placed close to the conduction channel, in the semiconductor layer between the source and drain electrodes or on the opposite side of the gate electrode with respect to the electrical insulator and semiconductor layers, alongside the source and drain electrodes, said piezoelectric layer being electrically isolated from said source and drain electrodes and from the semiconductor layer.

The piezoelectric layer is thus configured to generate a mechanical wave between the source and drain electrodes when a voltage $V_{SD}$ is applied to the source and drain electrodes and a voltage $V_G$ is applied to the gate electrode.

The mechanical wave generated between the source and drain electrodes in the semiconductor layer lowers the potential barrier between the metal and the semiconductor, thus making it possible to improve the injection of charges in the semiconductor layer and thereby increasing the number of charges flowing in the conduction channel.

According to one or more features of the organic transistor, taken individually or in combination: an insulation layer is inserted between the piezoelectric layer and the source and drain electrodes; the longitudinal axis of said piezoelectric layer is approximately parallel to an axis defined by the source and drain electrodes; the material of the piezoelectric layer has an electromechanical coupling coefficient greater than 30%; the thickness of the piezoelectric layer is variable, at least in the inter-electrode space; said piezoelectric layer extends at least up to said source and drain electrodes; said insulation layer extends at least up to said source and drain electrodes; said semiconductor layer is of the p-type and said insulation layer has a permittivity of less than 3; the piezoelectric layer is in natural-crystal, synthetic-ceramic or polymeric form; and the organic transistor includes an external power supply means for said piezoelectric layer.

BRIEF DESCRIPTION OF THE DRAWINGS

Other advantages and features will become apparent on reading the description of the invention and from the following figures in which:

FIG. 1 is a schematic view in vertical cross section of an organic field-effect transistor according to a first embodiment;

FIG. 2 is an enlarged partial view of FIG. 1 in operation, in which the mechanical wave propagation is shown;

FIG. 4 is a view similar to FIG. 1 of an organic field-effect transistor according to a second embodiment;

FIG. 5 shows an embodiment variant of the transistor of FIG. 3;

FIG. 6 shows another embodiment variant of the transistor of FIG. 3;

FIG. 7 shows a fourth embodiment variant of the transistor of FIG. 3; and

FIG. 8 is a graph illustrating the variation in the intensity of the current flowing through the transistor of FIG. 1 as a function of the voltage $V_G$ applied to the gate electrode of a transistor that includes a piezoelectric layer and of a conventional transistor.

DETAILED DESCRIPTION OF THE PREFERRED EMBODIMENTS

Figure 3A:
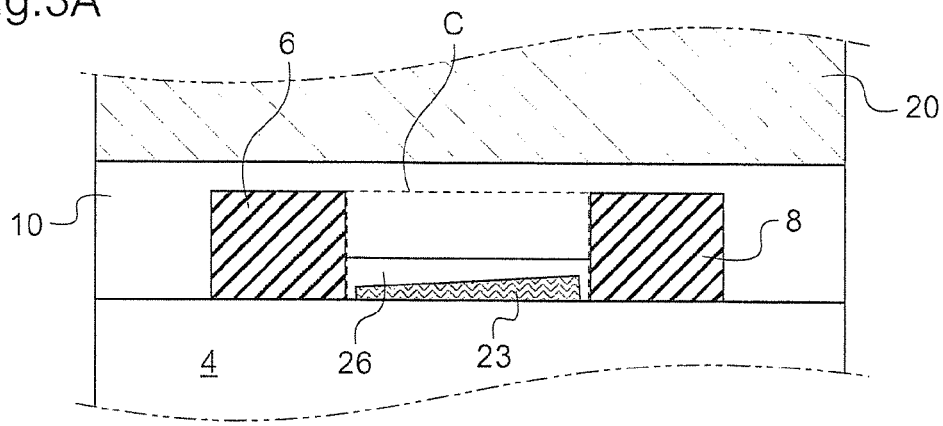
FIGS. 3A, 3B and 3C are enlarged schematic views in vertical cross section of alternative embodiment variants of the piezoelectric layer of the transistor of FIG. 1.

In all the figures, identical elements bear the same reference numbers.

FIG. 1 shows an organic field-effect transistor 2 fabricated according to a first embodiment. The transistor 2 has a substrate 4 on which a source electrode 6 and a drain electrode 8 are produced. The substrate 4 has, for example, a thickness of 125 um and the source 6 and drain 8 electrodes have a thickness of at least 30 nm. Here, the thicknesses are measured in a vertical direction Z perpendicular to the face of the substrate 4 on which the various electrodes and layers forming the transistor 2 are deposited. The source 6 and drain 8 electrodes are spaced apart by an inter-electrode space C.

A semiconductor layer 10 made of an organic semiconductor material is deposited at least between the electrodes 6 and 8, for example over the electrodes 6 and 8. The organic semiconductor layer 10 may be of a p-type or n-type and may be in the form of polymers or crystals.

This semiconductor layer 10 is in direct mechanical and electrical contact with the electrodes 6 and 8 and fills at least the inter-electrode space C separating the electrodes 6 and 8. The term "direct contact" means here that the contact takes place without passing via an intermediate layer. The minimum thickness of the semiconductor layer 10 is for example 50 nm and 500 nm, such as 100 nm.

An electrical insulator layer or a dielectric layer 20 is interposed between the gate electrode and the semiconductor layer 10. The lower face of the electrical insulator layer 20 is in direct mechanical contact with the upper face of the semiconductor layer 10. This electrical insulator layer 20 enables a gate electrode 22 to be electrically isolated from the semiconductor layer 10. The thickness of the electrical insulator layer 20 is for example between 50 nm and 2 um, such as 800 nm.

The gate electrode 22 is placed substantially above the inter-electrode space C separating the electrodes 6 and 8. The gate electrode 22 has for example a thickness between 100 nm and 1 um, such as 100 nm. This gate electrode 22 is capable of creating an electric field that increases the density of electrical charge carriers at the interface between the semiconductor layer 10 and the electrical insulator layer 20, so as to create a conduction channel in the semiconductor layer 10. This is because, since the layer 20 is an electrical insulator, the charge carriers capable of moving are only located beside the semiconductor layer 10. The conduction channel enables the charges (the current $I_{ON}$) to flow between the source electrode 6 and the drain electrode 8 when a voltage $V_{SD}$ is also applied between these electrodes. In this state, the transistor 2 is said to be in the on-state. Conversely, when no voltage $V_G$ is applied to the gate electrode 22, no conduction channel is created so that only a very small current $I_{off}$ can flow between the electrodes 6 and 8 when a voltage $V_{SD}$ is applied between them. In the case illustrated by the figures, the voltage $V_G$ applied to the electrode 22 in order to make the transistor 2 switch from the off-state to the on-state is negative.

The transistor 2 further includes a piezoelectric layer 23 placed close to the conduction channel (more precisely, beneath the conduction channel in the examples shown in the figures) in the semiconductor layer 10 between the source 6 and drain 8 electrodes or on the opposite side of the gate electrode 22 with respect to the electrical insulator 20 and semiconductor 10 layers, alongside the source 6 and drain 8 electrodes, said piezoelectric layer being electrically isolated from said source 6 and drain 8 electrodes and from the semiconductor layer 10.

The piezoelectric layer 23 is thus configured to generate a mechanical wave between the source 6 and drain 8 electrodes when a voltage $V_{SD}$ is applied to the source 6 and drain 8 electrodes.

The mechanical wave generated between the source 6 and drain 8 electrodes in the semiconductor layer 10 lowers the potential barrier between the metal and the semiconductor, thus making it possible to improve the injection of charges into the semiconductor and thereby increasing the number of charges flowing in the conduction channel.

Now, when a voltage $V_{SD}$ is applied between the electrodes 6 and 8, an electric field is applied to the piezoelectric layer 23. The variation in electric field at the terminals of the piezoelectric layer 23 therefore creates a mechanical wave.

In the first embodiment illustrated in FIG. 1, the piezoelectric layer 23 is placed between the source 6 and drain 8 electrodes, in the inter-electrode space C. The piezoelectric layer 23 is deposited in such a way that the longitudinal axis I-I of the piezoelectric layer 23 is approximately parallel to an axis defined by the source 6 and drain 8 electrodes, so as to direct the mechanical waves between said electrodes.

Thus, when an electric field is applied to the terminals of the piezoelectric layer 23, the crystalline structure of the latter contracts or expands in a preferential direction, resulting in a macroscopic strain of the layer 23. The strain is proportional to the voltage which is applied thereto. When the transistor 2 is in operation, the electric field applied to the terminals of the piezoelectric layer 23 is that already applied between the source 6 and drain 8 electrodes. Thus, there is no need for another voltage source for supplying the piezoelectric layer 23: the voltage $V_{SD}$ imposed across the source 6 and drain 8 electrodes is used. The potential difference between the electrodes is for example between +15 V and −40 V for a p-type semiconductor layer. For a ceramic piezoelectric layer, the mechanical strain generated is then proportional to the supply voltage.

It is also possible to provide the organic transistor 2 with an external voltage supply 11 connected directly to the terminals of the piezoelectric layer 23 (see for example FIG. 4). The piezoelectric layer 23 of the transistor can then be supplied independently of the operation of the transistor 2.

For example, a pulsed DC voltage or an alternating field can be applied, with a frequency and a power that are adapted to the desired mechanical strain, which are then able to be higher than those permitted by the transistor 2. An acoustic or mechanical wave can therefore be created thanks to the alternating field thus subjecting the piezoelectric layer to a constant strain under this repeatedly reversed field.

A beam of compressive and torsional mechanical waves is then emitted, and this propagates in the semiconductor layer 10. FIG. 2 illustrates the propagation of the mechanical waves 24 starting from the source electrode 6 during the transient phase to the on-state of the transistor 2. These strains act by exerting a stress on the conduction channel, improving the conduction in the channel. Furthermore, the propagation of the generated wave acts by lowering the barrier of the traps by increasing the velocity of the charges during charge transport in the semiconductor layer 10. The mechanical wave thus supplies additional energy, aiding the current flow between the source 6 and drain 8 electrodes during the change of state of the transistor, thus making it possible to reduce its response time. Furthermore, the presence of this wave at the drain electrode 8 improves charge capture.

For a p-type semiconductor layer, the electric field $V_{SD}$ between the source electrode 6 and the drain electrode 8 is negative, so that the mechanical waves are preferentially directed in the direction from the source 6 to the drain 8 (see the arrow 25). The charges are therefore transported and accelerated by the mechanical waves 24 towards the drain electrode 8. The piezoelectric layer 23 therefore acts as a "suction device", sucking up the charges and moving them towards the drain electrode 8.

It is conceivable for the thickness of the piezoelectric layer 23 to vary along the longitudinal axis I-I, at least in the inter-electrode space C, by giving the piezoelectric layer 23 a specific shape for accentuating a wave propagation direction between the source electrode 6 and the drain electrode 8.

Figure 3B:
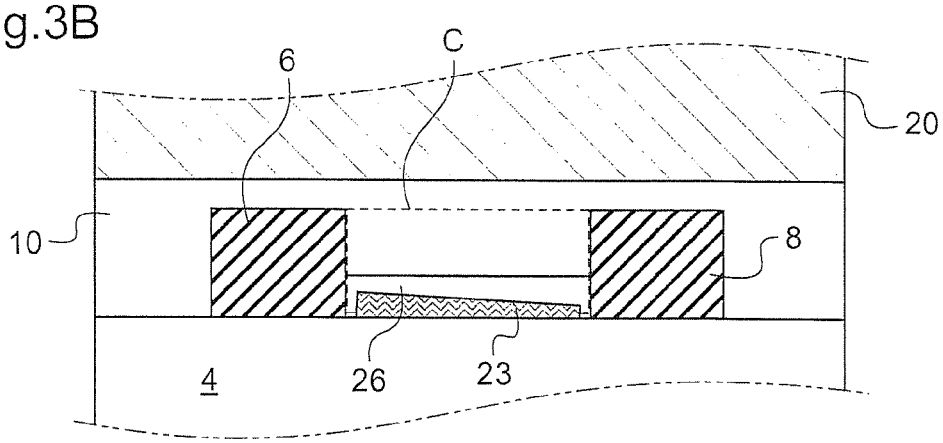
Figure 3C:
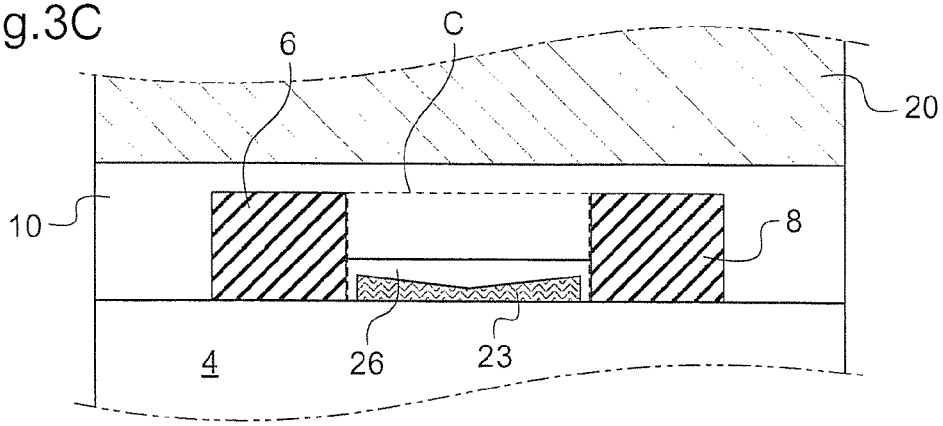

FIGS. 3A, 3B and 3C illustrate embodiments of the piezoelectric layer 23. In the embodiment shown in FIG. 3A, the piezoelectric layer 23 has a trapezoidal general shape with a thickness that increases from the source electrode 6 towards the drain electrode 8. This therefore promotes charge capture by the drain electrode 8. In the embodiment shown in FIG. 3B, the piezoelectric layer 23 also has a trapezoidal general shape, but with a thickness that decreases from the source electrode 6 towards the drain electrode 8. Charge transport towards the drain electrode 8 is therefore promoted. Furthermore, in the embodiment shown in FIG. 3C, the piezoelectric layer 23 has a recessed general shape, with a thickness that decreases then increases from the source electrode 6 towards the drain electrode 8. The charge channeling is therefore focused towards the electrodes.

The operating principle for a transistor having an n-type semiconductor layer is similar, the sign of the bias voltages $V_G$ and $V_{SD}$ and the preferential direction of propagation of the mechanical wave being reversed.

The thin piezoelectric layer 23 has for example a thickness between 1 nanometer and 1 micron depending on the nature of the material, which may be of any type.

The layer may take the form of natural crystals, such as quartz, topaz, tourmaline, berlinite ($AlPO_4$), sugar or Rochelle salt, gallium orthophosphate ($GaPO_4$); hydroxyapatite or gallium arsenate ($GaAsO_4$) crystals; ceramics of perovskite crystal structure or of tungsten-bronze structure ($PbTiO_3$, $BaTiO_3$, $KNbO_3$, $LiNbO_3$, $LiTaO_3$, $BiFeO_3$, $NaxWO_3$, $Ba_2NaNb_5O_5$, $Pb_2KNb_5O_{15}$ or $Pb(Zr_{0.5}Ti_{0.5})O_3$). These materials have an electromechanical coupling coefficient k of greater than 30%, k representing the ratio of the mechanical energy obtained to the electrical energy supplied.

It is also possible to use a piezoelectric layer made of a synthetic ceramic, such as a PZT ceramic (lead zirconate titanate of chemical formula $Pb(Zr_x,Ti_{1-x})O_3$). The thickness of the synthetic ceramic piezoelectric layer is for example between 0.5 um and 1 um.

It is also possible to use a piezoelectric layer made of a polymer, such as polyvinylidine difluoride (PVDF) or $(CH_2CF_2)_n$ and its derivatives, or langasite ceramics (for example the compound $Ba_3NbFe_3Si_2O_{14}$). Piezoelectric polymers have the advantage of being easy to process and therefore inexpensive. However, they have low electromechanical coupling coefficients (12 to 15% in the case of PVDF and up to 30% in the case of the copolymer P(VDF-TrFE)).

Finally, it may be advantageous to choose a piezoelectric material that is also pyroelectric, such as ammonium phosphotellurate. Its heat-up during operation of the transistor may improve the performance thereof.

For electrically isolating the piezoelectric layer 23 from the semiconductor layer 10 and from the source 6 and drain 8 electrodes, it is possible, for example, depending on the shape of the piezoelectric layer, to provide an insulation layer 26 inserted between the piezoelectric layer 23 and the source 6 and the drain 8 electrodes. The insulation layer 26 prevents short-circuiting between the source 6 and drain 8 electrodes and the piezoelectric layer 23.

In the case where the piezoelectric layer 23 does not touch the source 6 and drain 8 electrodes and in the case of an n-type semiconductor, this insulation layer is not necessary. However, in the case of a p-type semiconductor, this insulation layer 26 becomes very useful in order for the piezoelectric layer 23 not to disturb the semiconductor. It is then advantageous to choose a layer of insulation having a permittivity of less than 3.

To improve the performance of the transistor 2, the insulation layer 26 is placed in such a way that its thickness in the vertical direction Z is as small as possible, and thus forms no barrier to the mechanical wave, while still providing good insulation without having too high a capacitance. The thickness of the insulation layer 26 depends on the material used for the piezoelectric layer 23. However, a thin layer is chosen, for example with a thickness of between 10 and 500 nanometers. A thickness smaller than 150 nm makes any limitation or attenuation in the propagation of the mechanical wave negligible.

According to a second embodiment, shown in FIGS. 4 to 7, the piezoelectric layer 23 is placed on the substrate 4 of the transistor 2 and beneath the source 6 and drain 8 electrodes. The longitudinal axis I-I of the piezoelectric layer 23 is approximately parallel to an axis defined by the source 6 and drain 8 electrodes.

According to a first variant, the piezoelectric layer 23 is placed beneath the inter-electrode space C (FIG. 4). Furthermore, the insulation layer 26 extends beneath the source 6 and drain 8 electrodes.

According to a second variant, the piezoelectric layer 23 is placed beneath the inter-electrode space C and the insulation layer 26 extends beyond the source 6 and drain 8 electrodes (see FIG. 5).

According to a third variant, the piezoelectric layer 23 is placed on the substrate 4 of the transistor 2 and extends on one side from under the source electrode 6 to the other side under the drain electrode 8 (FIG. 6).

According to a fourth variant, the piezoelectric layer 23 is placed on the substrate 4 and extends beyond the source 6 and drain 8 electrodes (FIG. 7).

However, preferred embodiments are those for which the piezoelectric layer 23 is confined in or beneath the inter-electrodes space C (FIGS. 1, 4 and 5) since in this way the formation of parasitic capacitances or biases between the source 6 and drain 8 electrodes and the piezoelectric layer 23 is limited.

All these embodiments correspond to what is called a "top gate" transistor architecture. However, the present invention also applies to other architectures, for example such as what is called a "bottom gate" or "vertical gate" architecture (only the substrate changes position). To illustrate the improvement in the $I_{on}/I_{off}$ ratio of the transistor 2 compared with a transistor that does not include a piezoelectric layer, FIG. 8 is a graph showing the variation in intensity of the current $I_{DS}$ flowing between the source 6 and drain 8 electrodes as a function of the voltage $V_G$ applied to the gate electrode 22 for a p-type transistor 2 that includes a piezoelectric layer 23 (curve 27) and for a p-type transistor that does not include a piezoelectric layer (curve 28).

For both curves 27, 28, when the voltage $V_G$ is positive the intensity of the current $I_{DS}$ is equal to the intensity of the current $I_{off}$. When the voltage $V_G$ is between 0 and about 10 V, the intensity of the current $I_{DS}$ then increases proportionally to the voltage $V_G$ (linear regime). Beyond this, in the case of both curves 27, 28, the intensity of the current $I_{DS}$ saturates in a steady-state regime.

Thus it may be seen that, for a low voltage $V_{SD}$, the action of the piezoelectric layer 23 is also slight so that its integration into the transistor 2 does not modify the operation of the transistor 2 in the off-state. Only the same very low current $I_{off}$ can flow between the electrodes 6 and 8.

On the other hand, for a high voltage $V_{SD}$, the intensity of the current $I_{DS}$ of an organic transistor 2 that includes a piezoelectric layer 23, in the linear or steady-state regime, is higher by several decades than the intensity of the current $I_{DS}$ of a conventional organic transistor. The action of the piezoelectric layer 23 then becomes important and serves to increase the slope of the current as a function of the gate voltage $V_G$, thereby enabling the intensity of the current $I_{on}$ to be increased.

It will, therefore, be understood that such a transistor 2 that includes a piezoelectric layer 23 close to the conduction channel considerably improves the injection and transport of charges in the conduction channel.

Having described preferred embodiments which serve to illustrate various concepts, structures and techniques which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. An organic field-effect transistor comprising:
   source and drain electrodes;
   a semiconductor layer made of an organic semiconductor material placed at least between said source and drain electrodes;
   a gate electrode suitable for creating an electric field said electric field in turn increasing the density of mobile charge carriers in the semiconductor layer in order to create a conduction channel in said semiconductor layer between the source and drain electrodes when a voltage $V_G$ is applied to the gate electrode; and
   an electrical insulator layer interposed between the gate electrode and the semiconductor layer,
   characterized in that said organic field-effect transistor further includes a piezoelectric layer proximate to the conduction channel in the semiconductor layer between the source and drain electrodes, or on the opposite side of the gate electrode with respect to the electrical insulator and semiconductor layers and alongside the source and drain electrodes, said piezoelectric layer being electrically isolated from said source and drain electrodes and from the semiconductor layer.

2. The organic transistor according to claim 1, characterized in that an insulation layer is inserted between the piezoelectric layer and the source and drain electrodes.

3. The organic transistor according to claim 2 characterized in that said piezoelectric layer extends at least up to said source and drain electrodes and further characterized in that said insulation layer extends at least up to said source and drain electrodes.

4. The organic transistor according to claim 2 characterized in that said semiconductor layer is of the p-type and in that said insulation layer has a permittivity of less than 3.

5. The organic transistor according to claim 1 characterized in that a longitudinal axis of said piezoelectric layer is approximately parallel to an axis defined by the source and drain electrodes.

6. The organic transistor of claim 1 characterized in that the material of the piezoelectric layer has an electromechanical coupling coefficient greater than 30%.

7. The organic transistor according to claim 1 characterized in that the piezoelectric layer varies in thickness in the inter-electrode space (C).

8. The organic transistor according to claim 1, characterized in that said piezoelectric layer extends at least up to said source and drain electrodes.

9. The organic transistor according to claim 1 characterized in that the piezoelectric layer is in natural-crystal, synthetic-ceramic or polymeric form.

10. The organic transistor according to claim 1 characterized in that it includes an external power supply means for said piezoelectric layer.

* * * * *